(12) United States Patent
Hieda et al.

(10) Patent No.: US 6,278,164 B1
(45) Date of Patent: *Aug. 21, 2001

(54) SEMICONDUCTOR DEVICE WITH GATE INSULATOR FORMED OF HIGH DIELECTRIC FILM

(75) Inventors: Katsuhiko Hieda; Yoshitaka Tsunashima, both of Yokohama; Keitaro Imai; Tomonori Aoyama, both of Kawasaki, all of (JP)

(73) Assignee: Kabushiki Kaisha Toshiba, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/996,704

(22) Filed: Dec. 23, 1997

(30) Foreign Application Priority Data

Dec. 26, 1996 (JP) .................................................. 8-356493

(51) Int. Cl.$^7$ .............................. H01L 29/76; H01L 29/94
(52) U.S. Cl. ......................... 257/410; 257/295; 257/344; 257/412
(58) Field of Search .................................. 257/410, 411, 257/401, 406, 412, 388, 344, 330, 295; 438/216, 259, 261, 270, 271, 288, 287, 585, 587

(56) References Cited

U.S. PATENT DOCUMENTS

| 3,731,163 | * | 5/1973 | Shuskus | 257/324 |
| 5,024,959 | * | 6/1991 | Pfiester | 438/231 |
| 5,166,096 | * | 11/1992 | Cote et al. | 257/752 |
| 5,258,645 | * | 11/1993 | Sato | 257/637 |
| 5,289,030 | * | 2/1994 | Yamazaki et al. | 257/57 |
| 5,378,652 | * | 1/1995 | Samata et al. | 257/637 |
| 5,384,729 | * | 1/1995 | Sameshima | 257/295 |
| 5,521,411 | * | 5/1996 | Chen et al. | 257/408 |
| 5,733,812 | * | 3/1998 | Ueda et al. | 438/289 |

FOREIGN PATENT DOCUMENTS

| 62-136022 | * | 6/1987 | (JP) . |
| 4-123439 | | 4/1992 | (JP) . |

OTHER PUBLICATIONS

Kwok K. Ng; "Complete Guide to Semiconductor Devices"; Section 42.5.2, p. 335, 1995.*

Lyn et al.; "Metal–Ferroelectric–Semiconductor Field–Effect Transistor (MFSFET) for Single Transistor Memory by Using Poly–Si Source/Drain and BaMgF$_4$ Dielectric", IEDM'96 TECH. DIGEST, pp. 503–506, Dec. 8–11, 1996.

* cited by examiner

Primary Examiner—Steven Loke
Assistant Examiner—Hung Kim Vu
(74) Attorney, Agent, or Firm—Finnegan, Henderson, Farabow, Garrett, & Dunner, L.L.P.

(57) ABSTRACT

A p-type silicon substrate has an element isolation region of an STI structure formed therein. A transistor region isolated by the isolation region has a n-type source/drain diffusion layer. Further, a p-channel impurity layer is formed substantially only in its channel region for controlling its threshold voltage (Vth). A gate insulator film consisting of a high dielectric film is formed on the channel region with an Si$_3$N$_4$ film interposed therebetween. A metal gate electrode having its bottom and side surfaces covered with the gate insulator film is provided in a self-alignment manner with respect to the source/drain diffusion layer.

27 Claims, 8 Drawing Sheets

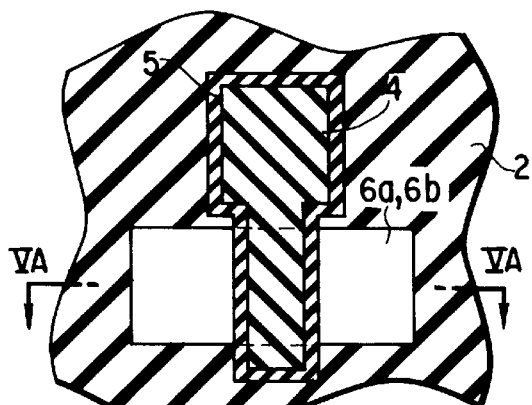
F I G. 4A
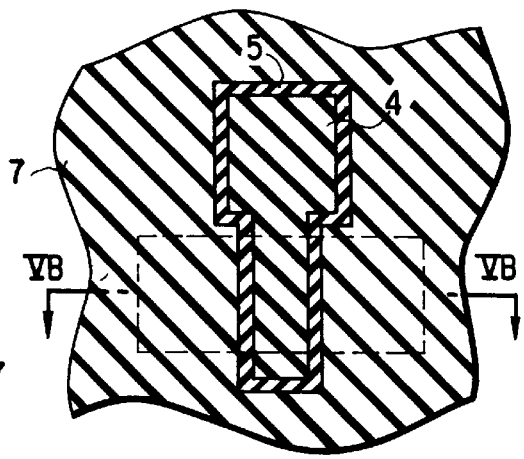
F I G. 4B
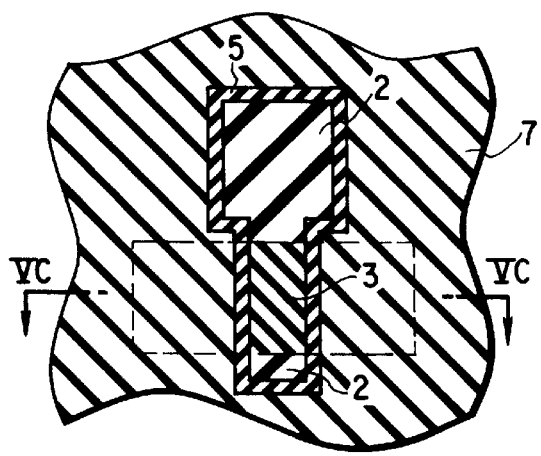
F I G. 4C
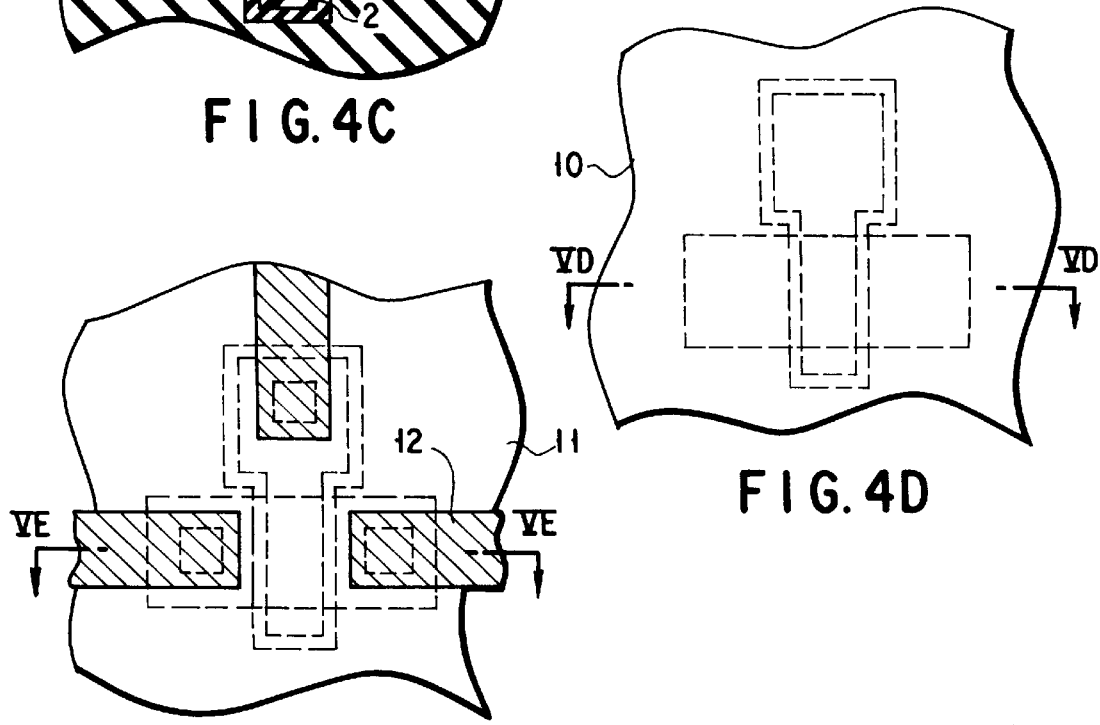
F I G. 4D
F I G. 4E

SEMICONDUCTOR DEVICE WITH GATE INSULATOR FORMED OF HIGH DIELECTRIC FILM

BACKGROUND OF THE INVENTION

This invention relates to a semiconductor apparatus and a manufacturing method therefor, and more particularly to a semiconductor apparatus which incorporates a gate electrode having its side and bottom surfaces covered with gate insulator films, and a manufacturing method therefor to which a high temperature treatment is applicable.

This application is based on Japanese Patent Application No. 8-356493, filed on Dec. 26, 1996, the contents of which is cited herein by reference.

In a MOS (metal oxide semiconductor) transistor using a $SiO_2$ film as a gate oxide film, it is important to thin the gate oxide film more than ever, in order to enhance the performance of the short channel transistor. It is considered, however, a problem in practical use to thin the gate oxide film by more than a thickness (e.g. about 3 nm or less) at which direct tunneling will occur.

As a method for solving the problem, it is proposed to form the gate oxide film of a so-called "high dielectric film" (such as a $Ta_2O_5$ film) in place of the $SiO_2$ film, in order to reduce the $SiO_2$ equivalent film thickness and at the same time to restrain a leak current (due to direct tunneling) between the gate electrode and the substrate or a source and drain region of the transistor.

If in the transistor using the high dielectric film, however, a high temperature step ranging from 800–1000° C. (including an annealing step to activate a source/drain ion implantation layer, a step for reflowing an interlayer film, etc.) is performed after the high dielectric film as the gate oxide film and a gate electrode made of a metal are formed, interface reaction will occur between Si substrate and the high dielectric film or between the high dielectric film and the gate electrode. Therefore, it is difficult for the transistor with the high dielectric film to endure the high temperature step, and the high dielectric film may well degrade. Accordingly, a transistor of high electric characteristics is hard to obtain.

Referring to FIGS. 1A and 1B, the above-described conventional problems will be explained in more detail. In these figures, reference numeral 31 denotes a silicon substrate, reference numeral 32 an element isolating region formed by the STI (Shallow Trench Isolation), reference numeral 33 a gate insulating film, reference numeral 34 a gate electrode, and reference numeral 35 a source/drain layer.

If, for example, the source/drain layer 35 is formed before the gate electrode 34, to protect the gate electrode 34 from a heat treatment performed for obtaining the layer 35, it is possible that the source/drain layer 35 will not be aligned with the gate electrode 34 as shown in FIG. 1A. This is a serious problem. Further, it must be considered how to execute, during a flattening step, a heat treatment such as a reflowing treatment to be performed after the gate electrode 34 is formed.

On the other hand, when the gate electrode 34 is formed before the source/drain layer 35 as in the prior art, it is necessary to form a gate insulator film 33 by interposing a high dielectric film between $SiO_2$ films as shown in FIG. 1B, in order to enable the gate electrode to endure a high temperature step such as a step for activating the source/drain layer 35 or for reflowing the interlayer film. Thus, the total thickness of the gate insulator film inevitably increases.

In addition, to increase the breakdown voltage between the gate electrode 34 and the source/drain layer 35 and to enhance the reliability of the element, post-oxidation is generally performed after the gate electrode 34 is formed. The composition of the high dielectric film changes after the post-oxidation step (performed at, for example, about 900° C. for about 30 minutes), with the result that the leak current of the gate insulator film 33 may well increase, which means degradation in the characteristics of the gate insulator film.

As described above, where a high dielectric film is used as the gate insulator film, it may well degrade since it does not have a heat resistance sufficient for a high temperature treatment required to form the semiconductor apparatus. Accordingly, a transistor of excellent electric characteristics is hard to obtain.

BRIEF SUMMARY OF THE INVENTION

It is the object of the invention to provide a semiconductor apparatus in which a high dielectric film or a ferroelectric film can be used as a gate insulator film, and a high temperature treatment is not necessary, and also provide a method for manufacturing the semiconductor apparatus.

According to a first aspect, there is provided a semiconductor apparatus comprising: a substrate with a source/drain region formed therein; a gate electrode provided above the substrate; and a gate insulator film covering bottom and side surfaces of the gate electrode.

The semiconductor element includes an element of a transistor structure having a source, a drain and a gate, such as an MIS transistor, a ferroelectric memory element, etc.

Since in this structure, the bottom and side surfaces of the gate electrode are covered with the gate insulator film, a sufficient breakdown voltage can be secured between the gate electrode and the substrate or between the gate electrode and the source/drain region, without post-oxidation performed in the conventional case. Moreover, the gate insulator film is provided also on the side surfaces of the gate electrode, which enables the channel length of the semiconductor element to be made shorter by twice the thickness of the gate insulator film than a minimum value limited by the lithography. In addition, since a depression which will be formed at a corner during the STI is filled with the gate insulator film, formation of a parasitic transistor at the corner can be restrained, thereby reducing the range of variations in threshold voltage of a MOS transistor, etc. It is preferable that the gate insulator film on the bottom and side surfaces of the gate electrode has a substantially uniform thickness. To this end, the gate insulator film is formed by, for example, the CVD (Chemical Vapered Deposition) method.

According to a second aspect of the invention, there is provided a method for manufacturing a semiconductor apparatus comprising the steps of: forming a dummy gate pattern on a semiconductor substrate; implanting an impurity into the semiconductor substrate, using the dummy gate pattern as a mask, to form a source/drain region; forming an insulator film on side surfaces of the dummy gate pattern; removing the dummy gate pattern; forming a gate insulator film on bottom and side surface of a groove formed by the removal of the dummy gate pattern; and filling a conductive material into the groove covered with the gate insulator film to form a gate electrode.

According to a third aspect of the invention, there is provided a method for manufacturing a semiconductor apparatus comprising the steps of: forming first and second dummy gate patterns on a semiconductor substrate; implanting an impurity into the semiconductor substrate, using the dummy gate patterns as masks, to form source/drain regions; forming insulator films on the side surfaces of the first and second dummy gate patterns; removing the first dummy gate pattern, and forming a first gate insulator film on bottom and side surface of a first groove formed by the removal of the first dummy gate pattern; removing the second dummy gate pattern, and forming a second gate insulator film on bottom and side surface of a second groove formed by the removal of the second dummy gate pattern; and filling a conductive material into the first and second grooves covered with the first and second gate insulator films, to form first and second gate electrodes, respectively.

In the method of the invention, various high temperature treatments such as activation of an impurity implanted in the source/drain region can be performed before the gate electrode and the gate insulator film are formed, thereby preventing the gate insulator film (in particular, if the gate insulator film is formed of a high dielectric film) from being degraded by the high temperature treatments. Furthermore, since a high temperature treatment for forming a silicide layer or an epitaxial growth silicon layer on the source/drain region can be also performed before the formation of the gate electrode and the gate insulator film, the resistance of the source/drain region can be minimized by the silicide layer or the epitaxial growth silicon layer even when the gate insulator film is formed of a high dielectric film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4E are plan views for explaining a manufacturing method of the semiconductor apparatus shown in FIGS. 2 and 3;

DETAILED DESCRIPTION OF THE INVENTION

The embodiments of the invention will be described with reference to the accompanying drawings.

Figure 1A:
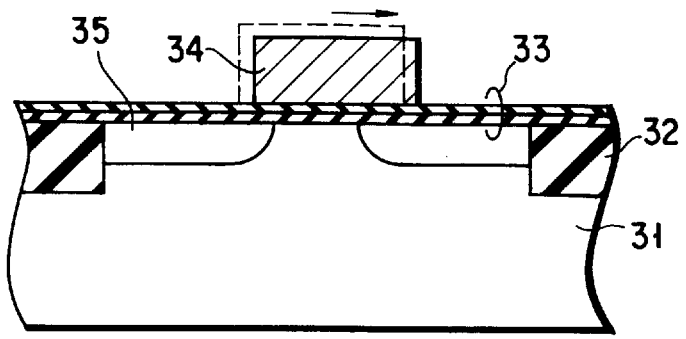
FIGS. 1A and 1B are views for explaining a conventional semiconductor apparatus.
Figure 1B:
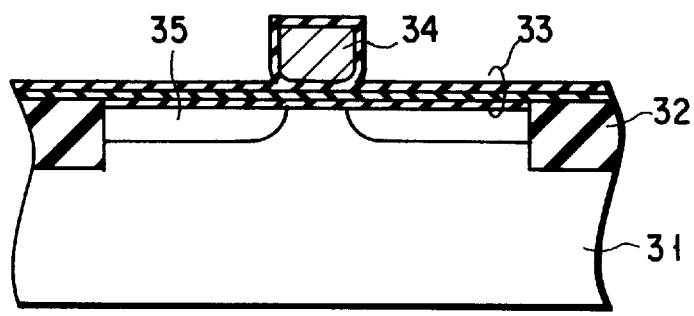
Figure 2:
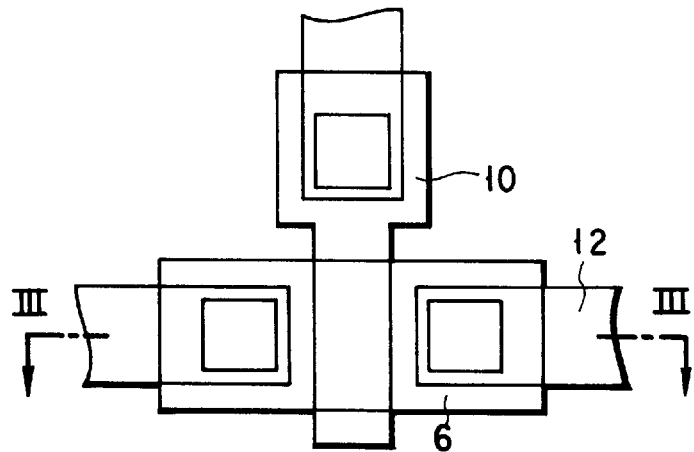
FIG. 2 is a view showing a structure of a semiconductor apparatus according to first embodiment of the invention.
Figure 3:
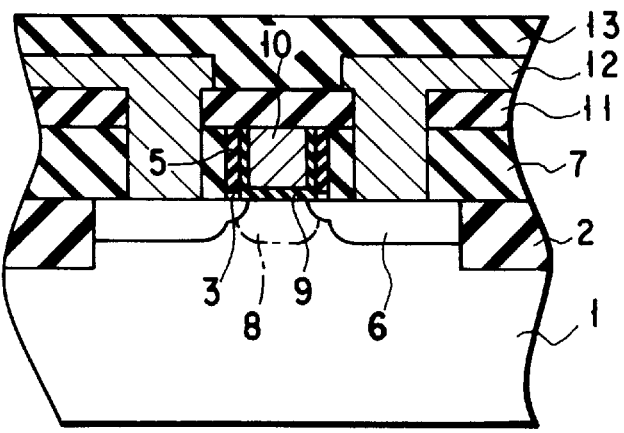
FIG. 3 is a sectional view of the semiconductor apparatus shown in FIG. 2.

Referring first to FIGS. 2 and 3, a first embodiment of the invention will be described.

FIG. 2 is a plan view of a single transistor employed in the first embodiment, and FIG. 3 is a sectional view of the transistor.

A p-type silicon substrate 1 with an impurity concentration of about $5 \times 10^{15}$ cm$^{-3}$ has an element isolating region 2 of an STI structure. A transistor region isolated by the element isolating region 2 includes a source/drain region 6 which consists of an n-type diffusion layer having a thickness of about 0.10 $\mu$m and an LDD (Lightly Doped Drain) structure with impurity concentrations of about $5 \times 10^{19}$ cm$^{-3}$ and about $5 \times 10^{20}$ cm$^{-3}$. Further, a p-channel impurity layer 8 with an impurity concentration of about $5 \times 10^{17}$ cm$^{-3}$ for controlling the threshold voltage (Vth) of the transistor is selectively formed mainly in a channel region defined in the region between the source and the drain.

A gate insulator film 9 consisting of a high dielectric film (Ta$_2$O$_5$ film) is formed on the substrate 1 in the channel region, with, for example, an Si$_3$N$_4$ film of a thickness of about 1 nm interposed therebetween. A gate electrode 10 formed of a metallic film (for example, a TiN film, a Ru film, a W film, an Al film, or a film obtained by stacking those films) and having its bottom and side surfaces covered with the gate insulator film 9 is provided on the substrate 1 such that it is formed in a self alignment manner with respect to the source/drain diffusion layer 6. The channel directional width is about 0.1–0.15 $\mu$m. Further, wiring 12 are connected to the source/drain diffusion layer 6 and the gate electrode 10 individually through contact holes formed in interlayer insulation films 7 and 11, and a passivation film 13 covers the overall structure.

Referring then to FIGS. 4A–4E and 5A–5E, a method for manufacturing the transistor shown in FIGS. 2 and 3 will be described. FIGS. 5A to 5E are sectional views corresponding to FIGS. 4A to 4E respectively.

Figure 5A:
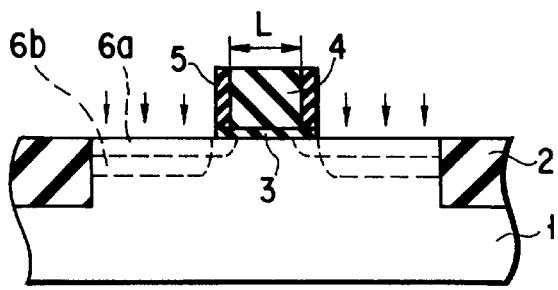
FIGS. 5A to 5E are sectional views for explaining the manufacturing method for the semiconductor apparatus shown in FIGS. 2 and 3.

As is shown in FIGS. 4A and 5A, a p-well (not shown) and an n-well (not shown) are formed in those portions of the plane of the p-type silicon substrate 1 with an impurity concentration of about $5 \times 10^{15}$ cm$^{-3}$, which are located in an n-channel transistor forming region and a p-channel transistor forming region, respectively. The substrate 1 may be an epitaxial substrate formed by growing a p-type or n-type epitaxial Si layer with a thickness of about 1 μm on an n-type or p-type Si substrate.

Then, a so-called trench-type isolating region 2 (with a depth of about 0.2 μm) is provided by forming a trench in the Si substrate 1 using a RIE (Reactive Ion Etching) treatment and filling the trench with an insulator film.

Subsequently, an SiO$_2$ film 3 with a thickness of about 5 nm is formed, and an Si$_3$N$_4$ film 4 with a thickness of about 300 nm is deposited on the overall surface of the film 3 and patterned into a dummy gate pattern 4 by lithography, RIE, etc. Although in the embodiment, the dummy gate pattern 4 is formed of the Si$_3$N$_4$ film, it may be formed of a polysilicon film in place of the Si$_3$N$_4$ film as in a second embodiment which will be described later. It suffices if the dummy gate pattern can be selectively removed, with an interlayer insulation film (e.g. an SiO$_2$ film) 7 (which will be formed in a later step) maintained as it is. In the case of using the polysilicon film, damage to the Si substrate 1 due to the RIE can be minimized since the etching selectivity of the polysilicon film to the SiO$_2$ film 3 during the RIE can be easily controlled.

The dummy gate pattern 4 has almost the same size and shape as a gate electrode formed in a later step, and extends even onto the element isolating layer 2. This means that the gate electrode pattern of the invention is similar to the conventional gate electrode pattern.

Thereafter, to form an LDD structure, P$^+$ ions are implanted in a acceleration voltage of about 70 KeV and dose of about $4 \times 10^{13}$ cm$^{-2}$, using, as a mask, the Si$_3$N$_4$ film 4 constituting the dummy gate pattern 4. As a result, an n$^-$-type diffusion layer 6a is formed. The overall surface is covered with an SiO$_2$ film and then etched by the RIE, thereby forming an SiO$_2$ film 5 with a thickness of about 20 nm on the side walls of the dummy gate pattern 4. Thereafter, As$^+$ ions are implanted in a acceleration voltage of about 30 KeV and dose of about $5 \times 10^{15}$ cm$^{-2}$, thereby forming an n$^+$-type diffusion layer 6b. Thus, an LDD or a gate extension structure is obtained.

The semiconductor apparatus may have a so-called single source/drain structure with only the diffusion layer 6a or 6b, instead of the LDD structure. Further, the channel directional width L shown in FIG. 5A corresponds to the channel length L of a usual gate electrode, and its minimum dimension depends upon a minimum dimension limited by lithography.

Figure 5B:
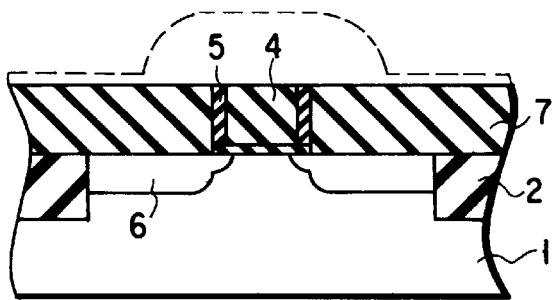

Subsequently, as is shown in FIGS. 4B and 5B, a CVD-SiO$_2$ film with a thickness of, for example, about 300 nm (indicated by the broken line) is deposited on the overall surface of the resultant structure, and then densified in the atmosphere of N$_2$ at about 800° C. for about 30 minutes. This heat treatment also serves to activate the ion-implanted layers of the source/drain layer 6. If the depth (Xj) of the diffusion layer should be reduced, the temperature for the densification is lowered to about 750° C., and the ions may be activated by performing a RTA (Rapid Thermal Annealing) treatment for about ten seconds at 950° C., in addition to the heat treatment for the densification. Thereafter, the overall surface of the resultant structure is flattened by a CMP (Chemical Mechanical Polishing) treatment, thereby exposing the dummy gate pattern 4 and the Si$_3$N$_4$ film.

Figure 5C:
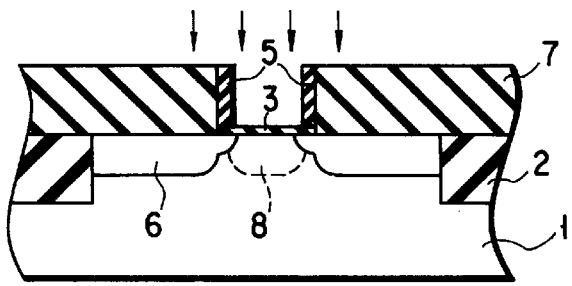

Then, as is shown in FIGS. 4C and 5C, the exposed dummy gate pattern 4 is removed, thereby exposing the element isolating region 2 and the SiO$_2$ film 3. Then, channel ion implantation is performed in only a desired channel region, using, as masks, a resist film (not shown), the interlayer insulation film 7 and the side wall insulator film 5. In the case of an n-channel transistor, to set its threshold voltage (Vth) at, for example, about 0.7V, B$^+$ ions are implanted into the channel region in, for example, a acceleration voltage of about 10 KeV and dose of about $5 \times 10^{12}$ cm$^{-2}$, thereby forming a p-channel impurity layer 8 only in the channel region. This ion implantation may be performed through the SiO$_2$ film 3, or through an SiO$_2$ film newly formed after the previous SiO$_2$ film 3 is removed. Moreover, the channel impurity layer 8 may be activated after the ion implantation by performing, for example, the RTA treatment for about ten seconds at 800° C.

Since no more high temperature treatment is required after the activation, the channel region can have an optimal sharp impurity profile, thereby restraining the short channel effect of the transistor.

Figure 5D:
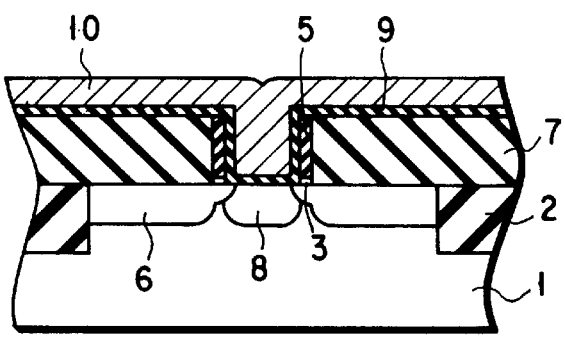

Subsequently, as is shown in FIGS. 4D and 5D, the SiO$_2$ film 3 is removed by etching using, for example, diluted hydrofluoric acid solution, and then a Ta$_2$O$_5$ film, a high dielectric film, with a thickness of about 20 nm is deposited as the gate insulator film 9 on the overall surface. At this time, in order to make it difficult for a so-called interface state to occur between the Si interface and the Ta$_2$O$_5$ film, a thin (about 1 nm thick) SiO$_2$ film (not shown) may be formed, or a film (not shown) obtained by directly nitriding Si surface in the atmosphere of NH$_3$ gas be formed by a RTP (Rapid Thermal Processing) treatment, or a high dielectric film (such as a Ta$_2$O$_5$ film, a (Ba,Sr)TiO$_3$ film, etc.) be formed via an Si$_3$N$_4$ film (not shown). Moreover, a stacked film including a CVD-SiO$_2$ film, a CVD-SiON film and a CVD-Si$_3$N$_4$ film may be used. In these cases, densification may be performed, after the film forming, by executing the RTP treatment, for example, at 1000° C. for about ten seconds. This can improve the characteristics of the gate insulator film, i.e. can eliminate the interface state at the Si interface of an underlayer, or reduce the leakage current.

Then, a metallic film 10 (such as a Ru film, a TiN film, a W film, a WNx film, an Al film, etc., or a film obtained by stacking these films), which will serve as a gate electrode, is deposited on the overall surface of the resultant structure. It is a matter of course that polycrystalline Si doped with an impurity may be used as the material of the gate electrode in the case of using, as the gate insulator film, the stacked film including the CVD-SiO$_2$ film, the CVD-SiON film and the CVD-Si$_3$N$_4$ film.

Figure 5E:
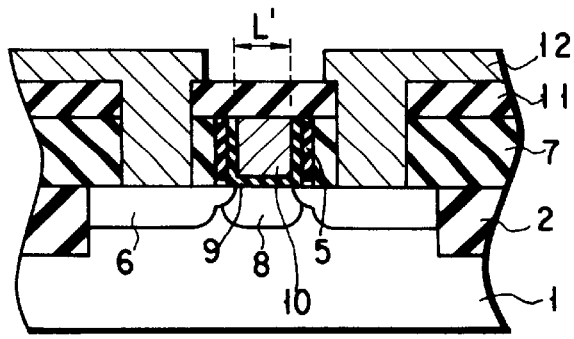

Thereafter, as is shown in FIGS. 4E and 5E, the groove formed after removing the dummy gate pattern 4 is filled with the metallic film 10 and the gate insulator film 9 by chemically mechanically polishing the overall surface, thereby forming the gate electrode. The width L' of the gate electrode shown in FIG. 5E is narrower than the width L shown in FIG. 5A by twice the thickness of the gate insulator film 9. Supposing that the minimum dimension limited by the lithography is L (0.15 μm in this embodiment), and the thickness of the gate insulator film is 0.02 μm, the width L' can be narrowed by twice the thickness of the gate insulator 9, i.e. 0.02 μm×2=0.04 μm. Accordingly, irrespective of the minimum dimension 0.15 μm limited by the lithography, the width L' of the gate electrode can be reduced to 0.11 μm, which means that the channel length of the transistor can be reduced to less than the minimum dimension limited by the lithography.

Subsequently, an SiO$_2$ film with a thickness of about 200 nm as an interlayer insulation film is deposited on the overall surface of the resultant structure, thereby forming a contact hole which reaches the source/drain layer 6 and the gate electrode 10, depositing an Al layer, and patterning the Al layer into a wire 12. Furthermore, a passivation film is deposited to complete a basic structure of the transistor as shown in FIG. 3.

In the above-described method for manufacturing a transistor, a high temperature heat treatment such as activation of the source/drain ion implantation layer or reflowing of the interlayer film can be performed before forming the metal gate or the gate insulator film consisting of the high dielectric film. Since the metal gate or the high dielectric gate insulator film is free from the high temperature heat treatment, degradation of the gate insulator film such as increase of leak current can be minimized.

Further, changing the method for processing the gate electrode from the RIE to the CMP eliminates limitations in selecting the material of the metal electrode, concerning workability, thermal resistance, etc., thereby enabling selection of a metal electrode material which can reduce the leak current of the high dielectric film. Moreover, the change enables the gate electrode to be free from a damage (such as dielectric breakdown) which may be caused by a plasma step employed in the RIE.

Also, in this embodiment, the gate pattern is provided after the formation of the source/drain diffusion layer, which differs from the conventional case. However, the gate electrode is formed in a self alignment manner with respect to the diffusion layer, using a dummy gate pattern. In other words, the gate electrode and the source/drain region are formed in a self alignment manner with respect to each other, as in the conventional case where the latter is formed in a self alignment manner with respect to the former.

Also, since in the embodiment, a channel ion implanted layer for adjusting the threshold voltage (Vth) is formed only in the channel region, the junction leak and the junction capacitance of the source/drain region can be reduced. The source/drain diffusion layer is free from a high temperature heat treatment for activation annealing, and hence can keep its sharp impurity profile. As a result, an optimal impurity profile for restraining the short channel effect can be realized.

Furthermore, in the semiconductor apparatus of the invention, the gate insulator film is formed after the removal of the dummy gate pattern. Therefore, the channel length of the transistor can be made shorter by twice the thickness of the gate insulator film than a minimum dimension limited by the lithography technique. As a result of the shortening of the channel length, the performance of the transistor can be enhanced.

In addition, in the semiconductor apparatus of the invention, the gate electrode, the gate insulator film and the interlayer insulating film, which are provided on the substrate, are formed substantially flat. Accordingly, any particular flattening treatment is not necessary after the formation of the gate electrode, which simplifies the entire process.

In addition, the gate insulator film formed by, for example, the CVD is filled in small depressions which may be formed at Si surface corners during the STI (in which depressions a gate insulator film and a gate electrode will be formed unless the gate insulator film is filled therein, thereby forming a parasitic transistor at the corners and changing the threshold voltage of the transistor). Thus, formation of a parasitic transistor at the corners is restrained, and hence the range of variations in threshold voltage is minimized.

Referring then to FIGS. 6A to 7B, a second embodiment of the invention will be described.

Figure 6A:
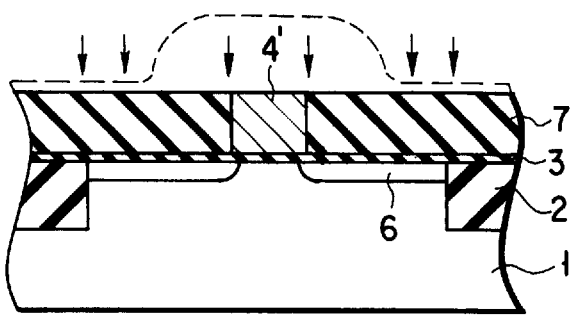
FIGS. 6A and 6B are sectional views showing steps of a manufacturing method for a semiconductor apparatus, according to a second embodiment of the invention.
Figure 6B:
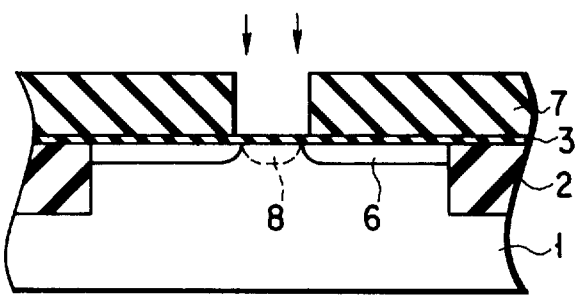

FIGS. 6A and 6B show process steps corresponding to those employed in the first embodiment and shown in FIGS. 5B and 5C, respectively. In FIGS. 6A and 6B, elements similar to those in the first embodiment are denoted by corresponding reference numerals.

Although in the first embodiment shown in FIG. 2, the Si$_3$N$_4$ film is used as the dummy gate pattern, another kind of film may be used if it can selectively be removed with respect to an SiO$_2$ film formed in a later step as the interlayer insulation film 7, thereby forming a groove for a gate pattern which will serve as a gate electrode. In the second embodiment, a polysilicon film is used as a dummy gate pattern 4'. Since the etching selectivity of the polysilicon film 4' to the SiO$_2$ film 3 can be easily controlled during the RIE, an etching damage to the Si substrate 1 can be easily restrained.

FIGS. 6A and 6B show a case where a single source/drain structure is employed in place of the LDD source/drain structure. In this case, ion implantation to form the source/drain region 6 is performed using a polysilicon film as a mask.

Figure 7A:
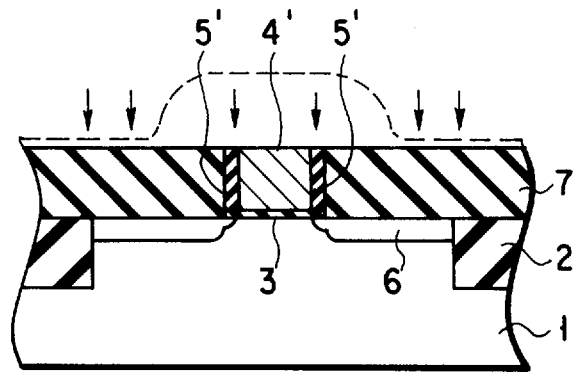
FIGS. 7A and 7B are sectional views for explaining a modification of the manufacturing method according to the second embodiment.
Figure 7B:
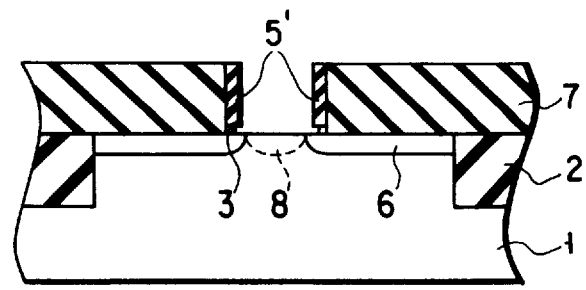

It is a matter of course that even when the polysilicon film is used as a dummy gate pattern, the source/drain region can have an LDD structure by performing so-called side wall remaining as in the first embodiment. FIGS. 7A and 7B show such a case and correspond to FIGS. 5B and 5C, respectively. In the case of using the polysilicon film as the dummy gate pattern 4', an Si$_3$N$_4$ film can be used as a dummy gate pattern side wall remaining film 5'. Using the Si$_3$N$_4$ film as the side wall remaining film 5' can prevent removal of the film 5' when removing the SiO$_3$ film 3. As a result, the dimension (L') of the gate electrode can be more easily controlled.

Figure 8:
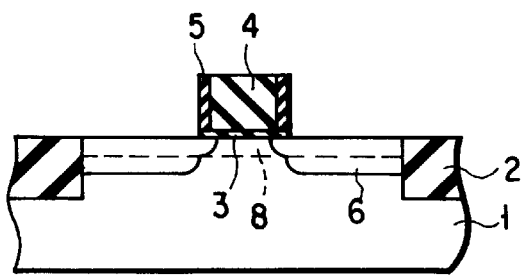
FIG. 8 is a sectional view showing a step of a manufacturing method for a semiconductor apparatus, according to a third embodiment of the invention.

Referring to FIG. 8, a third embodiment of the invention will be described.

FIG. 8 is a sectional view, showing a step corresponding to the step shown in FIG. 5A or FIG. 5C directed to the first embodiment. In FIG. 8, elements similar to those in the first embodiment are denoted by corresponding reference numerals.

Although in the first embodiment shown in FIGS. 5A to 5E, the channel impurity layer is formed only in the channel region, a channel region 8 may be provided, for simplification of the overall process, by forming the SiO$_2$ film 3 after element isolation, and then performing channel ion implantation in a desired region using a resist (not shown) as a mask. Since in this case, the heat treatment step for activating the source/drain diffusion layer 6 is performed after forming the channel impurity layer 8, it can serve both as an annealing step for activating the source/drain diffusion layer 6 and as a step for heating the channel ion implanted layer 8, which means the simplification of the overall process (although in this case, a sharp impurity profile cannot be obtained and hence the short channel effect cannot be restrained).

Figure 9:
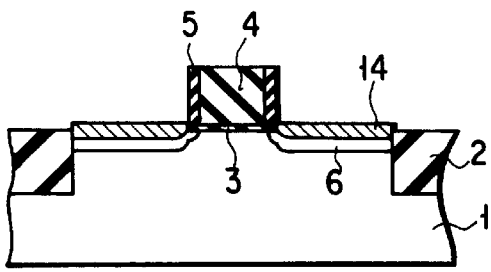
FIG. 9 is a sectional view showing a step of a manufacturing method for a semiconductor apparatus, according to a forth embodiment of the invention.

Referring then to FIG. 9, a fourth embodiment of the invention will be described. In FIG. 9, elements similar to those in the first embodiment are denoted by corresponding reference numerals.

Although the first embodiment of FIGS. 5A to 5E employs a usual source/drain diffusion layer, the fourth embodiment employs a silicide layer 14 provided on the source/drain diffusion layer 6 for reducing the resistance of the layer 6. When the silicide film 14 is provided, neither the gate insulator film nor the gate electrode is formed. Accordingly, the high dielectric gate insulator film or the metallic gate electrode is protected from degradation due to a heat treatment for silicification performed, for example, at 600° C. for about 30 minutes to form the film 14. Moreover, since the silicide film 14 and the gate electrode formed in a later step are isolated from each other by a gate insulator film which is free from a process damage due to the etching of the gate electrode, they are prevented from short-circuiting.

Figure 10:
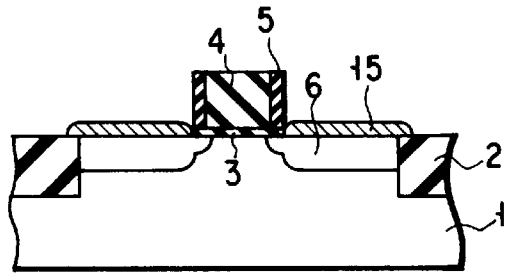
FIG. 10 is a sectional view showing a step of a manufacturing method for a semiconductor apparatus, according to a fifth embodiment of the invention.

Referring then to FIG. 10, a fifth embodiment of the invention will be described. In FIG. 10, elements similar to those in the first embodiment are denoted by corresponding reference numerals.

Although the first embodiment of FIGS. 5A to 5E employs a usual source/drain diffusion layer, the fifth embodiment employs an epitaxial Si layer 15 with a thickness of, for example, 50 nm is provided on an exposed Si substrate by selective epitaxial Si growth, in order to reduce the resistance of the source/drain diffusion layer. Ion implantation for forming the source/drain diffusion layer may be performed after or before the forming of the epitaxial Si layer.

In this embodiment, neither the gate insulator film nor the gate electrode is formed when the epitaxial Si layer 15 is formed. Accordingly, the high dielectric gate insulator film or the metallic gate electrode is protected from degradation due to a heat treatment for selective epitaxial Si growth (for example, a pre-treatment performed at 1000° C. for removing a natural oxide film formed on Si, or Si epitaxial growth performed at about 700° C.) Moreover, since the epitaxial Si layer and the gate electrode formed in a later step are isolated from each other by a gate insulator film which is free from a process damage due to the etching of the gate electrode, they are prevented from short-circuiting.

A sixth embodiment of the invention will be described.

Figure 11A:
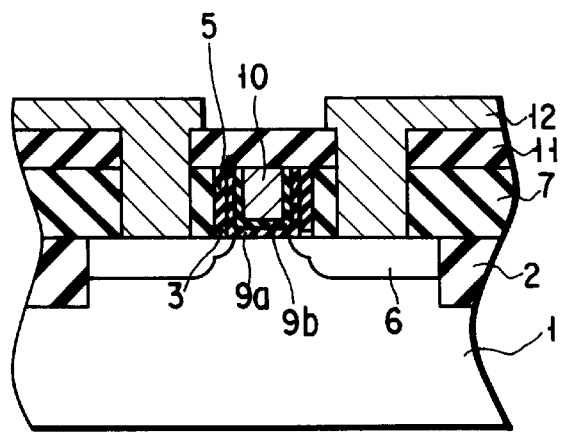
FIGS. 11A and 11B are views for explaining a semiconductor apparatus according to a sixth embodiment of the present invention.
Figure 11B:
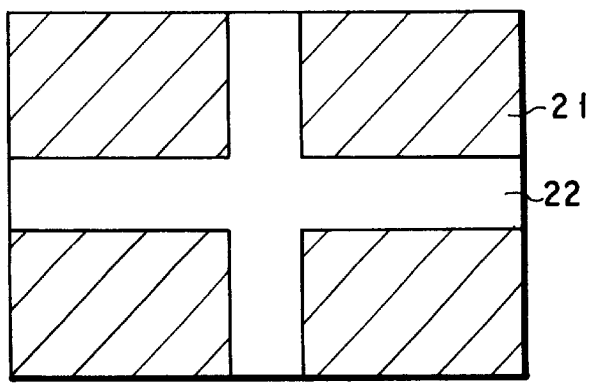

FIGS. 11A and 11B are views, useful in explaining a chip image obtained when a ferroelectric memory (FeRAM) is incorporated in a memory chip according to the sixth embodiment.

In the sixth embodiment, there are provided, on a single chip, a transistor using a high dielectric film as the gate insulator film, as in the first embodiment, etc., and a ferroelectric memory having an element structure similar to that of the transistor and using a ferroelectric film as the gate insulator film. As is shown in FIG. 11B, a memory cell 21 consists of a ferroelectric memory as shown in FIG. 11A, while a control circuit section (a peripheral transistor section) or a logic circuit section for controlling the memory cell section includes a transistor, which uses, as the gate insulator film, a high dielectric film as shown in FIGS. 2 and 3. In other words, optimal gate insulator films, which are of different kinds and thicknesses, can be used in the memory section and the control section (or the logic section) for controlling the memory section.

Referring now to FIGS. 12A to 15B, a manufacturing process according to this embodiment will be described. In these figures, elements similar to those in the first embodiment are denoted by corresponding reference numerals. FIGS. 12A, 13A, 14A and 15A show a memory cell section and FIGS. 12B, 13B, 14B and 15B show a peripheral transistor section.

Figure 12A:
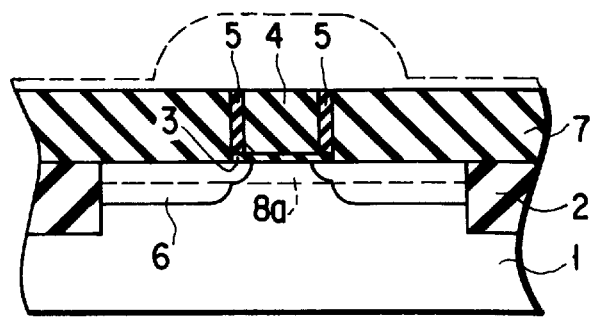
FIGS. 12A and 12B are sectional views showing a step of a manufacturing method of the semiconductor apparatus according to the sixth embodiment, which is shown in FIGS. 11A and 11B.
Figure 12B:
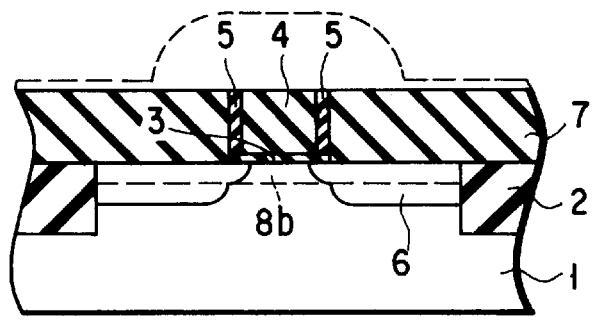

First, as is shown in FIGS. 12A and 12B, the overall memory cell section and peripheral transistor section are chemically mechanically polished to expose the surface of the dummy gate pattern 4 as in FIG. 5B employed in the first embodiment. This embodiment employs the method of the third embodiment (shown in FIG. 8), in which the source/drain region 6 is formed after channel ion implanted layers 8a and 8b (which are formed under the ion implanting conditions optimized so that the memory cell section and the peripheral transistor section can have optimal threshold voltage values (Vth)). It is a matter of course that channel ion implantation may be performed after the source/drain region 6 is formed as in the first embodiment.

Figure 13A:
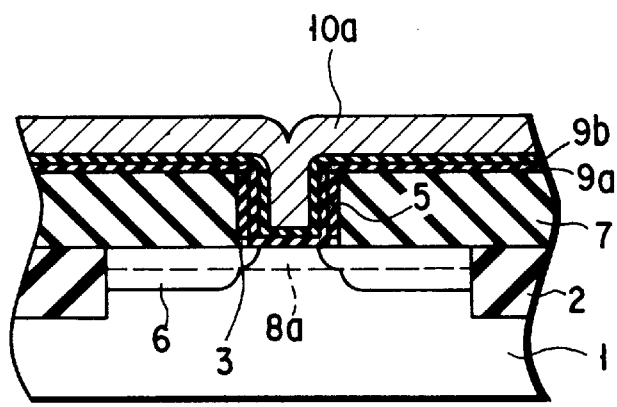
FIGS. 13A and 13B are sectional views showing a step of a manufacturing method of the semiconductor apparatus according to the sixth embodiment.
Figure 13B:
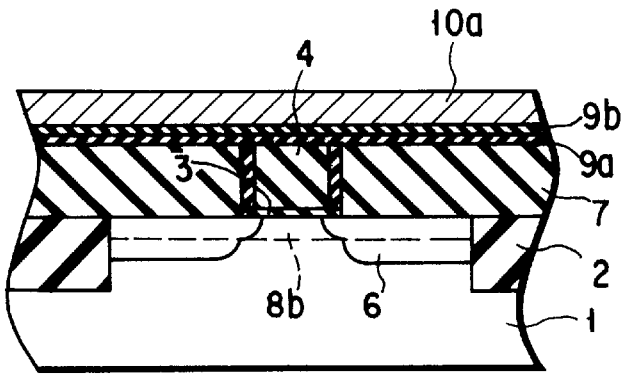

Then, as is shown in FIGS. 13A and 13B, the exposed dummy gate pattern ($Si_3N_4$ film) 4 of the memory cell section is removed by an etching solution of hot phosphoric acid, using a resist film (not shown) as a mask, thereby forming a groove in which a gate electrode is formed in a later step. Since at this time, the peripheral transistor section is covered with the resist film (not shown), the exposed dummy gate pattern ($Si_3N_4$ film) 4 is protected.

Subsequently, the $SiO_2$ film 3 on the channel region is removed to expose the Si substrate 1, and a ferroelectric film 9b is deposited thereon, with, for example, a dielectric film 9a interposed therebetween. The dielectric film 9a is provided for forming the ferroelectric film 9b in a stable manner, and consists of an $Si_3N_4$ film with a thickness of about 1 nm, or a $Ta_2O_5$ film (which is a high dielectric film) with a thickness of about 2 nm. Further, the ferroelectric film 9b may be made of $Bi_4Ti_3O_{12}$, PZT, PLZT, $BiSr_2Ta_2O_9$, $BaMgF_4$, etc., or may be formed of a $(Ba,Sr)TiO_3$ film with a thickness of about 20 nm epitaxially grown on an epitaxially grown $CeO_2$ film with a thickness of about 1 nm.

Then, a metallic film 10a, which will serve as a gate electrode and is made of Pt, Ru, Au, TiN, W, TiW, SRO ($SrRuO_3$), etc., a noble metal (Pd, Ir, Rh, Os, etc.), or metal oxide of one of those metals is deposited.

Figure 14A:
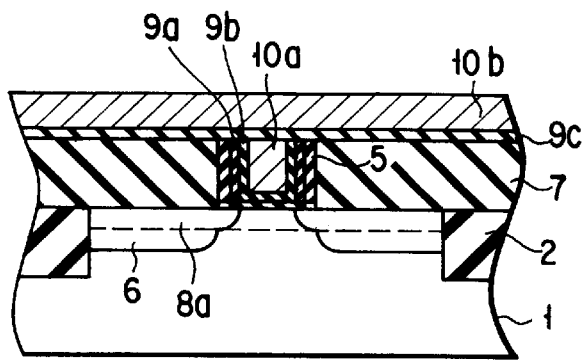
FIGS. 14A and 14B are sectional views showing a step of a manufacturing method of the semiconductor apparatus according to the sixth embodiment.
Figure 14B:
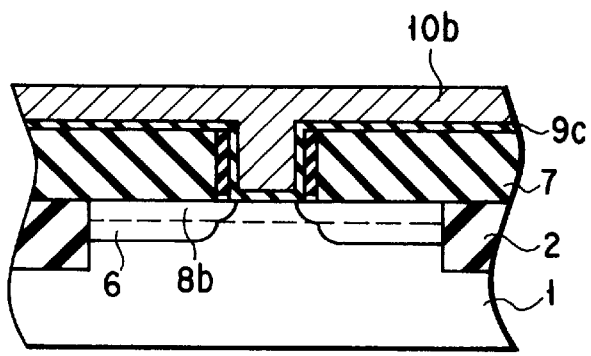

Then, as is shown in FIGS. 14A and 14B, the metal film 10a and the dielectric films 9a and 9b are chemically mechanically polished, thereby forming a gate electrode in the memory cell section. Subsequently, the exposed dummy gate pattern ($Si_3N_4$ film) 4 of the peripheral transistor section is removed by, for example, an etching solution of hot phosphoric acid, using, if necessary, a resist film (not shown) as a mask, thereby forming a groove in which a gate electrode is formed in a later step. Thereafter, the $SiO_2$ film 3 on the channel potion is removed to expose the Si substrate 1, and a gate insulator film 9c consisting of, for example, a high dielectric $Ta_2O_5$ film and having a thickness of about 20 nm is deposited on the overall surface of the resultant structure. At this time, in order to make it difficult for a so-called interface state to occur between the Si interface 1 and the high dielectric film, a pretreatment may be performed, or a thin (for example, about 1 nm thick) $SiO_2$ film may be formed between the Si substrate 1 and the high dielectric film (including a $(Ba,Sr)TiO_3$ film, etc. as well as the $Ta_2O_5$ film). Then, a metal film (such as a Pt film, a Ru film, a TiW film, a WNx film, a TiN film, a W film, a SRO ($SrRuO_3$) film, etc., a metal oxide film of one of those metals, or a stacked film of any of these films) 10b, which will serve as a gate electrode, is deposited on the overall surface of the resultant structure.

Figure 15A:
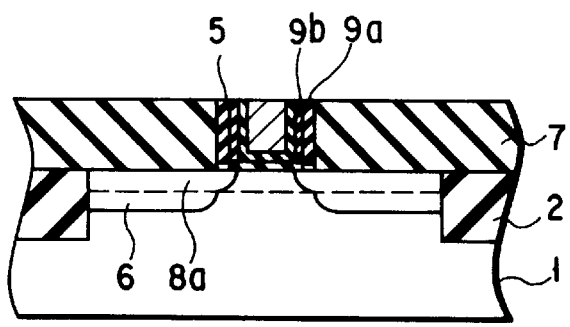
FIGS. 15A and 15B are sectional views showing a step of a manufacturing method of the semiconductor apparatus according to the sixth embodiment.
Figure 15B:
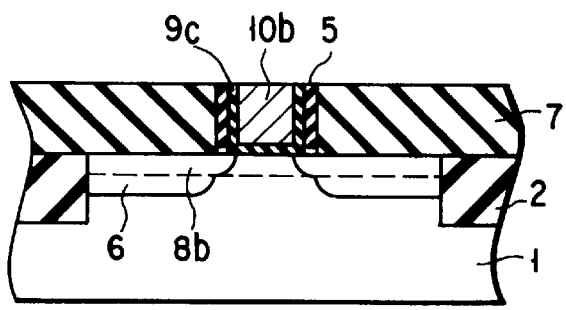

Thereafter, as is shown in FIGS. 15A and 15B, the metal film 10b and the dielectric film 9c are chemically mechanically polished, thereby forming the gate electrode of the peripheral transistor section. Subsequently, an SiO2 film with a thickness of about 200 nm (not shown) as an interlayer insulation film is deposited on the overall surface of the resultant structure, thereby opening contact holes for the source, the drain and the gate electrode of the peripheral transistor section, depositing an Al layer, and patterning the Al layer into wiring (not shown). At last, a passivation film (not shown) is deposited on the overall surface of the resultant structure, thus completing formation of the basic structure of the memory chip.

In the sixth embodiment, the memory cell section and the peripheral transistor section can each have a gate insulator film of an optimal material and thickness. In addition, a chip, wherein a single transistor memory using a ferroelectric film and high performance transistors (for peripheral circuits) each using a high dielectric film as the gate insulator film are integrated, can be produced by a small number of process steps, without degrading its performance.

Although in the sixth embodiment, the memory cell section and the peripheral transistor section are incorporated in a single chip, a logic circuit section may be incorporated in the chip, in addition to those sections.

Referring to FIGS. 16A to 17B, modification of the invention will be described.

The modifications differ from the sixth embodiment, in particular, in a manner for forming the channel impurity layer 8. In FIGS. 16A to 17B, elements similar to those shown in FIGS. 12A to 15B, etc. are denoted by corresponding reference numerals.

Figure 16A:
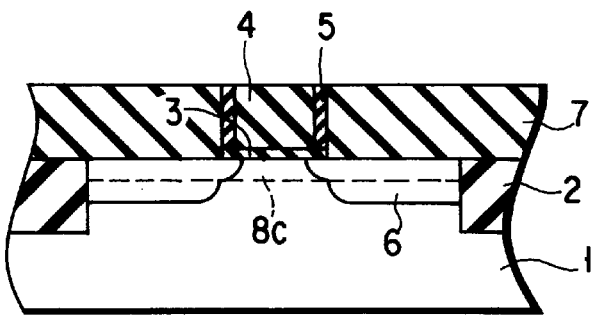
FIGS. 16A and 16B are sectional views for explaining showing a step of a manufacturing method of the semiconductor apparatus according to the sixth embodiment.
Figure 16B:
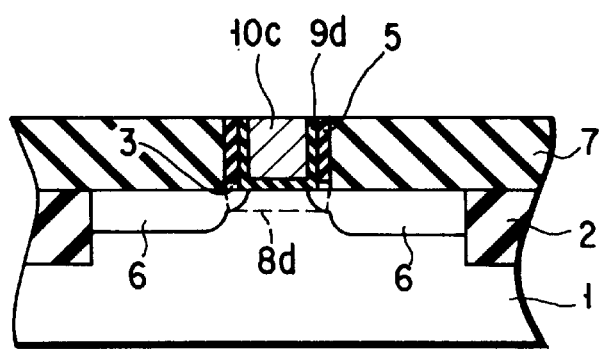

First, a modification shown in FIGS. 16A and 16B will be described. FIGS. 16A and 16B show a step corresponding to that performed between the step shown in FIGS. 12A and 12B and the step of in FIGS. 13A and 13B.

After the dummy gate pattern 4 of the peripheral transistor section is removed, a channel ion implanted layer 8*d* is formed only in the channel region of the section. Then, the channel ion implanted layer Bd is annealed and activated, thereby forming a gate electrode 10*c* and a gate insulator film 9*d* by the CMP method as in the sixth embodiment of FIG. 9. Further, the channel impurity layer 8*c* of the memory cell section overlap with the source/drain region 6 as is shown in FIGS. 16A and 16B.

According to this modification, the channel ion implanted layer 8*d* is formed only in the channel region of the peripheral transistor section, the junction leak and the junction capacitance of the source/drain region can be reduced.

Figure 17A:
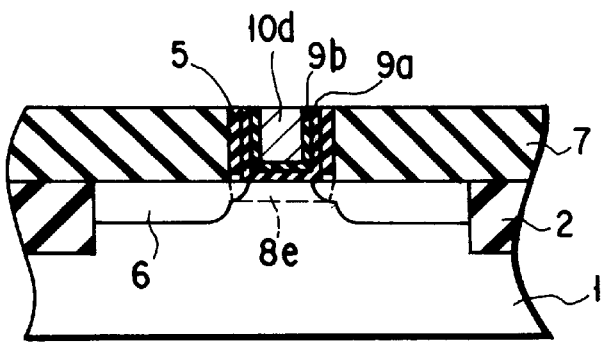
FIGS. 17A and 17B are sectional views for explaining a modification method of the manufacturing method according to the sixth embodiment.
Figure 17B:
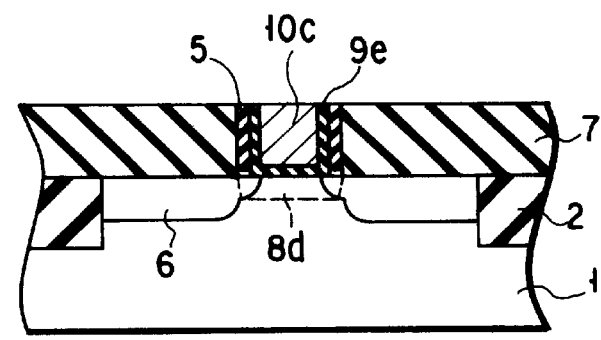

Next, a modification shown in FIGS. 17A and 17B will be described.

In this modification, a channel ion implanted layer 8*e* is formed in the memory cell section, as well as the ion implanted layer 8*d* in the peripheral transistor section. The channel ion implanted layer 8*e* of the memory cell section can be formed where in the peripheral transistor section, a gate insulator film 9*e* is formed of a stacking film which consists of a CVD-SiO$_2$ film, a CVD-Si$_3$N$_4$ film, etc., and a gate electrode 10*c* is formed of a n$^+$ polysilicon film, i.e. where the peripheral transistor section has a gate electrode/gate insulator film structure free from degradation of the gate insulator film even when a heat treatment of about 800° C. is performed.

Since in the semiconductor apparatus of the invention, the bottom and side surfaces of the gate electrode are covered with gate insulator films, an appropriate breakdown voltage can be secured between the gate electrode and the substrate or between the gate electrode and the source/drain region, without post-oxidation as performed in the prior art.

Moreover, the structure that the side surfaces of the gate electrode are covered with the gate insulator film enables the channel length of the semiconductor element to be made shorter by twice the thickness of the gate insulator film than the minimum dimension limited by the lithography, thereby enhancing the performance of the semiconductor element.

In addition, in the semiconductor apparatus of the invention, the gate electrode, the gate insulator film and the interlayer insulating film, which are provided on the substrate, are formed substantially flat. Accordingly, any particular flattening treatment is not necessary after the formation of the gate electrode, which simplifies the entire process.

Furthermore, in the semiconductor manufacturing method of the invention, various high temperature treatments such as a treatment for activating an impurity implanted into the source/drain region can be performed before the gate electrode and the gate insulator film are formed. Accordingly, the gate insulator film, which is formed of, for example, a high dielectric film, is free from degradation due to the high temperature treatment. Also, since the gate electrode can be formed by the CMP and not by the RIE employed in the prior art, damage due to plasma which will occur in the case of using the RIE can be avoided. In addition, since impurity ions are implanted using a dummy gate pattern as a mask, the gate electrode can be formed in a self-alignment manner with respect to the source/drain region.

As described above, the invention can provide a semiconductor element with high reliability and characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a gate electrode formed above a substrate;
    an interlayer insulation film formed on the substrate;
    a gate insulator film covering bottom and side surfaces of the gate electrode; and
    a sidewall insulator film formed between the interlayer insulation film and the gate insulator film,
    wherein top surfaces of the gate electrode, the interlayer insulation film, the gate insulator film, and the sidewall insulator are coplanar, and
    wherein the sidewall insulator film is formed of a material different from a material of the interlayer insulation film.

2. A semiconductor device according to claim 1, wherein the gate insulator film has a substantially uniform thickness at the bottom and the side surfaces.

3. A semiconductor device according to claim 1, wherein the gate insulator film is formed of a single-layer film containing material selected from a group consisting of Ba, Sr and Ti.

4. A semiconductor device according to claim 3, wherein an interface preventing layer is formed between the gate insulator film and the substrate.

5. A semiconductor device according to claim 4, wherein said interface preventing layer contains material selected from a group consisting of SiO$_2$ and a silicon nitride.

6. A semiconductor device according to claim 1, wherein the gate electrode is a metal gate electrode.

7. A semiconductor device according to claim 1, wherein an interface preventing layer is formed between the gate insulator film and the substrate.

8. A semiconductor device according to claim 7, wherein said interface preventing layer contains material selected from a group consisting of $SiO_2$ and a silicon nitride.

9. A semiconductor device according to claim 1, wherein said sidewall insulator film is formed of $Si_3N_4$ and said interlayer insulation film is formed of $SiO_2$.

10. A semiconductor device according to claim 1, wherein said substrate includes a source/drain region and a lightly doped drain region.

11. A semiconductor device according to claim 1, wherein said gate insulator film is formed of an insulator material exclusive of $SiO_2$.

12. A semiconductor device comprising:
a first gate electrode formed above a substrate;
an interlayer insulation film formed on the substrate;
a first gate insulator film covering bottom and side surfaces of the first gate electrode;
a sidewall insulator film formed between the interlayer insulation film and the first gate insulator film,
wherein top surfaces of the first gate electrode, the interlayer insulation film, the first gate insulator film and the sidewall insulator are coplanar, and
wherein the sidewall insulator film is formed of a material different from a material of the interlayer insulation film;
a second gate electrode formed above said substrate; and
a second gate insulator film covering bottom and side surfaces of said second gate electrode, and having a thickness different from the first gate insulator film, the second gate insulator film being formed of an insulator material exclusive of $SiO_2$.

13. A semiconductor device comprising:
a first gate electrode formed above a substrate;
an interlayer insulation film formed on the substrate;
a first gate insulator film covering bottom and side surfaces of the first gate electrode;
a sidewall insulator film formed between the interlayer insulation film and the first gate insulator film,
wherein top surfaces of the first gate electrode, the interlayer insulation film, the first gate insulator film and the sidewall insulator are coplanar, and
wherein the sidewall insulator film is formed of a material different from a material of the interlayer insulation film;
a second gate electrode formed above said substrate; and
a second gate insulator film covering bottom and side surfaces of said second gate electrode, the second gate insulator film being formed of an insulator material different from said first gate insulator film.

14. A semiconductor device according to claim 13, wherein the second gate insulator film is formed of a ferroelectric material.

15. A semiconductor device comprising:
a first gate electrode formed above a substrate;
an interlayer insulation film formed on the substrate;
a first gate insulator film covering bottom and side surfaces of the first gate electrode;
a sidewall insulator film formed between the interlayer insulation film and the first gate insulator film,
wherein top surfaces of the first gate electrode, the interlayer insulation film, the first gate insulator film and the sidewall insulator are coplanar, and
wherein the sidewall insulator film is formed of a material different from a material of the interlayer insulation film;
a second gate electrode formed above said substrate and formed of a material different from the first gate electrode; and
a second gate insulator film covering bottom and side surfaces of said second gate electrode.

16. A semiconductor device comprising:
a gate electrode formed above a substrate;
an interlayer insulation film formed on the substrate;
a gate insulator film covering bottom and side surfaces of the gate electrode, the gate insulator film being formed of a $Ta_2O_5$ film; and
a sidewall insulator film between the interlayer insulation film and the gate insulator film,
wherein top surfaces of the gate electrode, the interlayer insulation film, the gate insulator film and the sidewall insulator film are coplanar, and
wherein the sidewall insulator film is formed of a material different from a material of the interlayer insulation film.

17. A semiconductor device according to claim 16, wherein the gate insulator film has a substantially uniform thickness at the bottom and the side surfaces.

18. A semiconductor device according to claim 16, wherein an interface preventing layer is formed between the gate insulator film and the substrate.

19. A semiconductor device according to claim 18, wherein said interface preventing layer contains material selected from a group consisting of $SiO_2$ and a silicon nitride.

20. A semiconductor device according to claim 16, wherein the gate insulator film is formed of a single-layer film containing material selected from a group consisting of Ba, Sr and Ti.

21. A semiconductor device according to claim 16, wherein the gate electrode is a metal gate electrode.

22. A semiconductor device according to claim 16, wherein said sidewall insulator film is formed of $Si_3N_4$ and said interlayer insulation film is formed of $SiO_2$.

23. A semiconductor device according to claim 16, wherein said substrate includes a source/drain region and a lightly doped drain region.

24. A semiconductor device comprising:
a first gate electrode formed above a substrate;
an interlayer insulation film formed on the substrate;
a first gate insulator film covering bottom and side surfaces of the first gate electrode, the first gate insulator film being formed of a $Ta_2O_5$ film;
a sidewall insulator film between the interlayer insulation film and the first gate insulator film,
wherein top surfaces of the first gate electrode, the interlayer insulation film, and the first gate insulator film and the sidewall insulator film are coplanar, and
wherein the sidewall insulator film is formed of a material different from a material of the interlayer insulation film;
a second gate electrode formed above said substrate; and
a second gate insulator film covering bottom and side surfaces of said second gate electrode, and having a thickness different from the first gate insulator film, the second gate insulator film being formed of an insulator material exclusive of $SiO_2$.

25. A semiconductor device comprising:

a first gate electrode formed above a substrate;

an interlayer insulation film formed on the substrate;

a first gate insulator film covering bottom and side surfaces of the first gate electrode, the first gate insulator film being formed of a $Ta_2O_5$ film;

a sidewall insulator film between the interlayer insulation film and the first gate insulator film, wherein top surfaces of the first gate electrode, the interlayer insulation film, and the first gate insulator film and the sidewall insulator film are coplanar, and wherein said sidewall insulator film is formed of a material different from a material of said interlayer insulation film;

a second gate electrode formed above said substrate; and a second gate insulator film covering bottom and side surfaces of said second gate electrode, the second gate insulator film being formed of an insulator material different from said first gate insulator film.

26. A semiconductor device according to claim 25, wherein the second gate insulator film is formed of a ferroelectric material.

27. A semiconductor device comprising:

a first gate electrode formed above a substrate;

an interlayer insulation film formed on the substrate;

a first gate insulator film covering bottom and side surfaces of the first gate electrode, the first gate insulator film being formed of a $Ta_2O_5$ film;

a sidewall insulator film between the interlayer insulation film and the first gate insulator film, wherein top surfaces of the first gate electrode, the interlayer insulation film, and the first gate insulator film and the sidewall insulator film are coplanar, and wherein the sidewall insulator film is formed of a material different from a material of the interlayer insulation film;

a second gate electrode formed above said substrate and formed of a material different from the first gate electrode; and a second gate insulator film covering bottom and side surfaces of said second gate electrode.

* * * * *